US007868243B2

(12) United States Patent
Plissonnier et al.

(10) Patent No.: US 7,868,243 B2
(45) Date of Patent: Jan. 11, 2011

(54) METHOD FOR PRODUCING A NANOSTRUCTURE BASED ON INTERCONNECTED NANOWIRES, NANOSTRUCTURE AND USE AS THERMOELECTRIC CONVERTER

(75) Inventors: Marc Plissonnier, Eybens (FR); Frederic Gaillard, Voiron (FR); Raphael Salot, Lans en Vercors (FR); Jean-Antoine Gruss, Seyssinet-Pariset (FR)

(73) Assignee: Commissariat a l'Energie Atomique, Paris (FR)

( * ) Notice: Subject to any disclaimer, the term of this patent is extended or adjusted under 35 U.S.C. 154(b) by 775 days.

(21) Appl. No.: 11/826,293

(22) Filed: Jul. 13, 2007

(65) Prior Publication Data
US 2008/0142066 A1    Jun. 19, 2008

(30) Foreign Application Priority Data
Jul. 20, 2006    (FR)    ................... 06 06617

(51) Int. Cl.
*H01L 35/00*    (2006.01)
*H01L 21/44*    (2006.01)
(52) U.S. Cl. .................. 136/200; 438/666; 977/890
(58) Field of Classification Search ................. 136/200; 438/666; 428/396; 257/E21.476; 977/890
See application file for complete search history.

(56) References Cited
U.S. PATENT DOCUMENTS
7,267,859 B1 *    9/2007    Rabin et al. ................. 428/131

2002/0175408 A1    11/2002    Majumdar et al.
2005/0006673 A1    1/2005    Samuelson et al.
2005/0112872 A1    5/2005    Okamura et al.
2005/0181587 A1    8/2005    Duan et al.

FOREIGN PATENT DOCUMENTS
WO    WO 2005/117131 A1    12/2005

OTHER PUBLICATIONS
Matsumiya et al., "Nano-structured thin-film Pt catalyst for thermoelectric hydrogen gas sensor", 2003, Sensors and Actuators, B 93, pp. 309-315.*

(Continued)

*Primary Examiner*—Basia Ridley
*Assistant Examiner*—Tamir Ayad
(74) *Attorney, Agent, or Firm*—Oliff & Berridge, PLC

(57) ABSTRACT

Method for producing a nanostructure based on interconnected nanowires, nanostructure and use as thermoelectric converter The nanostructure comprises two arrays of nanowires made from respectively n-doped and p-doped semi-conducting material. The nanowires of the first array, for example of n type, are formed for example by VLS growth. A droplet of electrically conducting material that acted as catalyst during the growth step remains on the tip of each nanowire of the first array at the end of growth. A nanowire of the second array is then formed around each nanowire of the first array by covering a layer of electrically insulating material formed around each nanowire of the first array, and the associated droplet, with a layer of p-type semi-conducting material. A droplet thus automatically connects a nanowire of the first array with a single coaxial nanowire of the second array. This type of nanostructure can be used in particular to form a thermoelectric converter.

12 Claims, 2 Drawing Sheets

OTHER PUBLICATIONS

Lauhon et al., "Epitaxial core-shell and core-multishell nanowire heterostructures," *Nature*, vol. 420, pp. 57-61, Nov. 7, 2002.

Lauhon et al., "Semiconductor nanowire heterostructures," *Philosophical Transactions of the Royal Society of London*, vol. 362, pp. 1247-1260, Apr. 8, 2004.

Li et al., "Conversion of a Bi nanowire array to an array of $Bi_2O_3$ core-shell nanowires and $Bi_2O_3$ nanotubes," *Small*, vol. 2, No. 4, pp. 548-553, Apr. 2006.

Abramson et al., "Fabrication and Characterization of a Nanowire/Polymer-Based Nanocomposite for a Prototype Thermoelectric Device," *Journal of Microelectromechanical Systems*, vol. 13, No. 3, pp. 505-513, Jun. 2004.

Qiu et al., "Miniaturization of thermoelectric hydrogen sensor prepared on glass substrate with low-temperature crystallized SiGe film," *Sensors and Actuators B*, vol. 103, No. 1-2, pp. 252-259, Sep. 29, 2004.

\* cited by examiner

METHOD FOR PRODUCING A NANOSTRUCTURE BASED ON INTERCONNECTED NANOWIRES, NANOSTRUCTURE AND USE AS THERMOELECTRIC CONVERTER

BACKGROUND OF THE INVENTION

The invention relates to a method for producing a nanostructure comprising a growth step to form an array of nanowires on a substrate, said nanowires being made from doped semi-conducting material of a first type, each nanowire having, at the end of the growth step, a droplet of electrically conducting material on its tip, which droplet acted as catalyst during the growth step.

It also relates to a nanostructure obtained in this way and the use of same to constitute a thermoelectric converter.

STATE OF THE ART

As represented in FIG. 1, a thermoelectric converter is conventionally composed of thermocouples thermally connected in parallel between respectively hot and cold sources 1 and 2. Each thermocouple is formed by two branches 3 and 4 made from metallic or semi-conducting materials of different natures electrically connected in series. In FIG. 1, electrical connection between two adjacent branches 3 and 4 is performed by an electrically conducting connecting element 5 connecting the adjacent ends of the two branches either at the level of the hot source 1 or at the level of the cold source 2. The branches are in this way all electrically connected in series and thermally connected in parallel. This arrangement enables the electrical resistance of the converter and the heat flux (represented by vertical arrows in FIG. 1) passing through this converter to be optimized.

Such a converter can be used to generate an electric current by Seebeck effect when it is subjected to a thermal gradient between the hot and cold sources. In opposite manner, it can be used to create a thermal gradient by Peltier effect, and thus to create a thermoelectric cooling effect, when a current is flowing in the branches.

The efficiency of such a converter is directly proportional to the thermal gradient applied to the faces of the converter and to a figure of merit ZT, which depends directly on the electrical and thermal properties of the materials of the thermocouples and more particularly on their electrical conductivity $\rho$, their Seebeck coefficient S and their thermal conductivity $\lambda$.

It has been proposed to use nanowires to improve the efficiency of thermoelectric converters by using quantum confinement phenomena.

Thus, US patent application US-A-2002/0175408 describes fabrication of longitudinal and/or radial nanowire heterostructures using a crystalline growth method of vapor-liquid-solid (VLS) type to control the dimensions of the cross-section of the wires. The nanowires used to achieve a thermoelectric converter can for example be of radial structure, made from $Bi_2Te_3$ or SiGe. This document describes in greater detail an embodiment of a thermoelectric converter wherein an array of n-doped nanowires and an array of p-doped nanowires are embedded in polymer matrices so as to form two distinct packets having different doping. Each packet is completed by metallic contacts formed on each side of the packet, at the two ends of the nanowires, electrically connecting the nanowires in parallel within the packet. The n and p packets are then electrically connected in series and thermally connected in parallel, in conventional manner, by means of their metallic contacts.

A method of the same type is also described in the article "Fabrication and Characterization of a Nanowire/Polymer-Based Nanocomposite for a Prototype Thermoelectric Device", by Alexis R. Abramson et al., in "Journal of Microelectromechanical Systems", pages 505-513, vol. 13, n°3, June 2004.

The fabrication methods described in these documents only enable collective fabrication of packets of nanowires having the same chemical composition, for example n-type or p-type semi-conductors. As indicated above, the nanowires of the same nature are then electrically connected in parallel within each packet and at least two packets of different nature are interconnected to form a thermoelectric converter.

In US patent application US-A-2005/0112872, n-type and p-type nanowires are formed by electrolytic growth in a nanoporous matrix by selective activation of two groups of base metallic electrodes formed beforehand on a substrate. To achieve a thermoelectric converter, the n-type and p-type nanowires are then connected to one another by deposition of a first metallic connecting electrode, on the top of the nanowires. This first connecting electrode is preferably structured such as to individually connect a p-type nanowire to a single n-type nanowire. A second metallic connecting electrode is then formed at the base of the nanowires by modifying the initial connections of the base electrodes by means of two sets of holes successively formed in the substrate.

It has further been proposed to interconnect nanowires, in the plane of the substrate, by handling them individually, for example with an AFM tip or by self-organization methods.

A nanowire-based thermoelectric converter has therefore been achieved up to now either by interconnection of packets, each comprising nanowires of the same kind (p-type or n-type) formed simultaneously by VLS growth, or by individual interconnection of nanowires formed by electrolytic growth in pores of a layer of suitable material, for example a layer of aluminium.

OBJECT OF THE INVENTION

One object of the invention is to provide a method for producing a nanowire-based nanostructure, for example a thermoelectric converter, enabling an n-type nanowire and a p-type nanowire to be individually interconnected.

According to the invention, this object is achieved by a method according to the appended claims.

It is a further object of the invention to provide a nanostructure obtained in this way and to use this nanostructure to constitute a thermoelectric converter or a gas sensor.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF A PREFERRED EMBODIMENT OF THE INVENTION

Fabrication of a nanowire, in particular by VLS growth (see US-A-2002/0175408 and the above-mentioned article by A. R. Abramson), involves the use of a metal catalyst, for example made of gold. Throughout the nanowire growth phase, a droplet 6 of catalyst is disposed on the tip of the nanowire.

Figure 1:
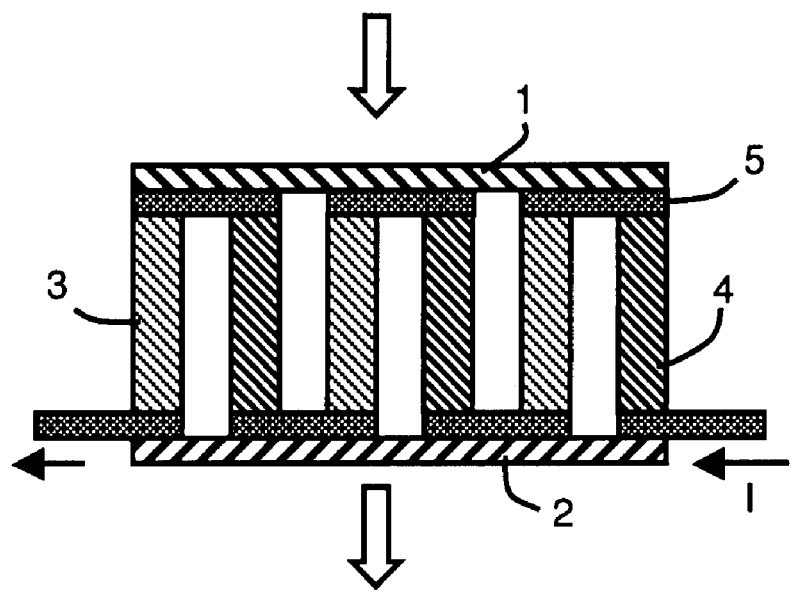
FIG. 1 schematically represents a thermoelectric converter according to the prior art.
Figure 2:
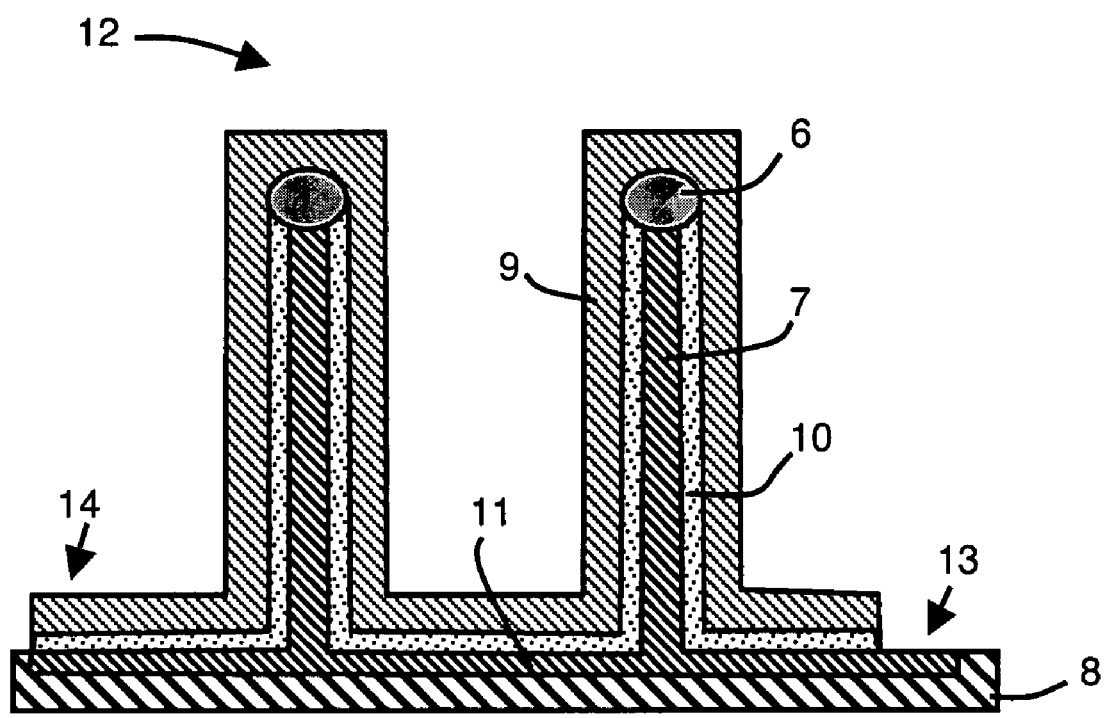
FIG. 2 illustrates individual interconnection of n-type and p-type nanowires according to the invention.

As represented in FIG. 2, a nanowire array 7 made from a doped semi-conducting material of a first type, for example n-type, is formed in known manner, for example by VLS growth, on a substrate 8. Any growth technique, in which a droplet 6 of catalyst of electrically conducting material remains on the tip of each nanowire 7 at the end of the nanowire growth phase, can be used. This droplet 6 is kept and used to individually and electrically connect the corresponding nanowire 7 and an associated nanowire 9 made from a doped semi-conducting material of a second type, i.e. p-type in the example considered.

At the end of the growth step of the n-type nanowires 7, a layer 10 of insulating material is formed around each nanowire 7, for example by selective oxidation of the nanowires 7 at the periphery of the latter. The layer 10 thus only covers the nanowire and not the corresponding droplet. The layer 10 and droplet 6 associated with each nanowire 7 are then covered by a layer made from p-doped material semi-conducting so as to form the nanowire 9 around the nanowire 7. This production method thereby automatically makes the electrical connection between two coaxial nanowires 7 and 9, by means of the corresponding droplet 6 which remains conducting. The material constituting the catalyst and/or the method used to oxidize the semi-conducting material forming the nanowires 7 are naturally selected such that only the semi-conducting material forming the nanowire 7 is oxidized. The material forming the droplets is preferably a noble material such as gold.

In a preferred embodiment illustrated in FIG. 2, a plurality of parallel nanowires 7 forming a first array of n-type nanowires are formed simultaneously by VLS growth on a layer of the same nature as the nanowires 7 (n-doped semi-conductor), formed in the substrate 8. Two adjacent nanowires 7 of the first array are then electrically connected by this layer, which constitutes a base 11 substantially perpendicular to the first array of nanowires. The insulating layer 10 then covers not only the periphery of the nanowires 7, but also the base 11, at least between two adjacent nanowires 7. The layer of p-type semi-conducting material then covers the whole of the insulating layer 10, both around and between the nanowires 7, as well as all the droplets 6 associated with the nanowires of the first array.

The production method described above therefore enables the first array of n-type nanowires 7 to be formed collectively, for example by VLS growth. Then, after formation of an insulating layer 10 (which does not cover the droplets 6), a second array of p-type nanowires 9 is formed, each nanowire 9 being arranged coaxially around an associated nanowire 7 whereto it is individually and automatically electrically connected by the droplet 6 that acted as catalyst during growth of the corresponding nanowire 7. As illustrated schematically in FIGS. 2 to 5, an assembly 12 formed in this way comprises at least two junctions electrically connected in parallel and each formed by series connection of a nanowire 7, of the corresponding droplet 6 and of the associated coaxial nanowire 9.

Each assembly 12 comprises two connection terminals. A first connection terminal 13 is formed by a zone of the base 11 salient from one side of the assembly 12 (on the right of FIGS. 2, 4 and 5) and not covered by the insulating layer 10. The second connection terminal 14 is preferably located in a different lateral zone, for example opposite (on the left of FIGS. 2 and 5), and formed in the p-type semi-conducting layer. The electrical connections of the assembly 12 with other assemblies or with the outside are thus preferably transferred to locations on each side of the assembly, substantially at the level of the substrate 8.

Figure 3:
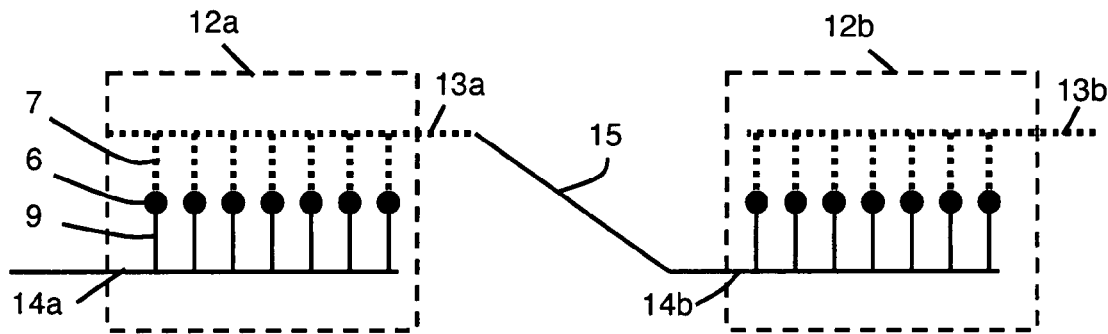
FIG. 3 represents the wiring diagram of a particular embodiment of a thermoelectric converter according to the invention.
Figure 4:
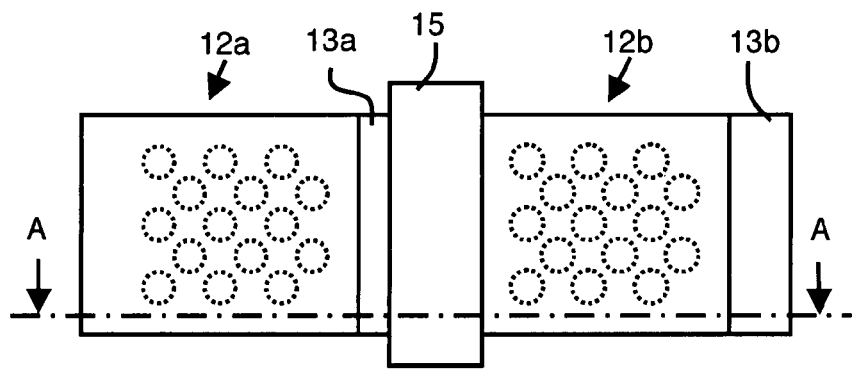
FIGS. 4 and 5 illustrate series electrical connection of two assemblies of a thermoelectric converter according to the invention, respectively in top view and in cross-section along A-A.
Figure 5:
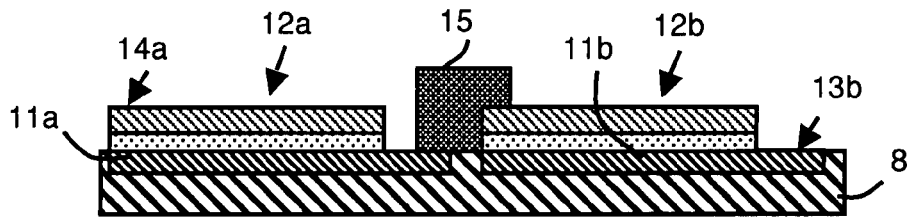

To form a thermoelectric converter, adjacent assemblies can be electrically connected in series using conventional microelectronics techniques. Such a connection between two adjacent assemblies 12a and 12b is illustrated in FIGS. 3 to 5 in which the first connection terminal 13a of the assembly 12a is connected to the second connection terminal 14b of the assembly 12b. Connection between two adjacent assemblies is for example achieved by means of a metal layer 15. In the particular embodiment of FIGS. 4 and 5, the metal layer 15 transversely covers at least a part of the zone constituting the first connection terminal 13a of the assembly 12a and of the zone constituting the second connection terminal 14b of the assembly 12b.

In FIG. 5, the bases 11a and 11b of the two adjacent assemblies 12a and 12b are formed by selective doping of two distinct zones of the substrate 8. In this case, the metal layer 15 covers the end of the terminal 13a, the portion of the substrate 8 separating the bases 11a and 11b and the end of the terminal 14b.

Figure 6:
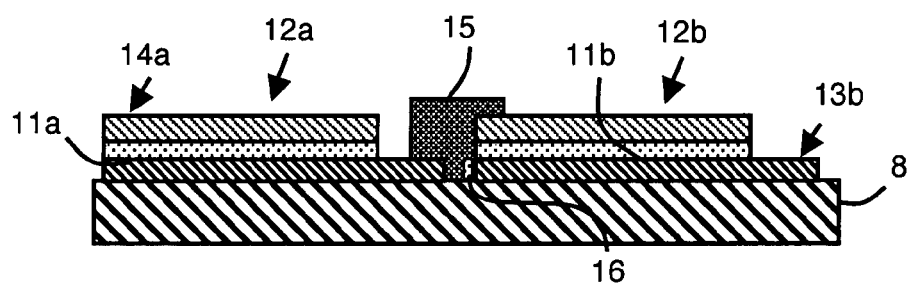
FIG. 6 represents an alternative embodiment of FIG. 5.

In an alternative embodiment represented in FIG. 6, the bases 11a and 11b are formed in two distinct zones of an n-type semi-conducting layer deposited on the substrate 8. In this case, an insulating layer 16 has to perform insulation of the end of the base 11b opposite its connection terminal 13b from the metal layer 15, to prevent any short-circuit between the bases 11a and 11b and between the base 11b and the terminal 14b of the corresponding assembly.

Collective and simultaneous connection of nanowires of different types enables the specific properties of the nanowires to be used to the full to increase the performances of nanostructures and, more particularly, of nanowire-based thermoelectric converters.

The nanostructure described above can also be used as a gas sensor, more particularly as a gaseous hydrogen detection system. The principle of a thermoelectric hydrogen sensor is in particular described in the article by Fabin Qiu et al., "Miniaturization of thermoelectric hydrogen sensor prepared on glass substrate with low-temperature crystallized SiGe film", Sensors and Actuators B 103, May 2004, p. 252-259. It consists in creating a thermal flux generated by catalytic decomposition of hydrogen on a catalyst (oxidation reaction of hydrogen at the surface of a platinum film) deposited on the hot junction of a thermoelectric converter (for example formed by a crystallized SiGe film). The presence of hydrogen can thus be detected by conversion of the thermal flux into electric voltage.

To use a nanostructure according to the invention as gas sensor, for example as hydrogen detector, a catalyst reacting with the gas to be detected (for example platinum for hydrogen detection) is disposed on the thermoelectric converter. The catalyst reacting with the gas to be detected is preferably finely divided and deposited in such a way as to cover the n/p junctions, constituting the hot source of the thermoelectric converter, at the free end of each nanowire 9, i.e. above its connection by the corresponding droplet 6 to the associated nanowire 7.

Such a detector presents the following advantages over known gas detectors:

The nanometric size of the catalyst designed to react with the gas to be detected, at the free end of each nanowire 9, enables operation at ambient temperature without a heating system. The finely divided catalyst designed to react with the gas to be detected is in fact much more reactive at this scale. The hydrogen detector can therefore be totally passive, i.e. it does not require any external power supply. The energy recovered can be used to indicate detection.

It is three-dimensional whereas known detectors are planar.

Due to the size of the nanowires, the hot source has an extremely low thermal mass compared with the cold source. The response time of the detection signal is therefore much lower than in planar technologies, which can constitute a key advantage.

We claim:

1. A nanostructure comprising:
   a plurality of first nanowires, wherein:
      each first nanowire is made of doped semi-conducting material of a first type;
      each first nanowire includes an associated second nanowire made of doped semi-conducting material of a second type,
      wherein one of the first and second type is p-doped and the other is n-doped; each first nanowire is coaxial with its associated second nanowire and is separated from its associated second nanowire by an insulating material;
      each second nanowire has a tip; and
      a droplet is disposed on the tip of each second nanowire so as to individually electrically connect the second nanowire to its associated first nanowire.

2. The nanostructure according to claim 1, wherein at least two adjacent first nanowires are connected by a layer of doped semi-conducting material of the first type, constituting a base substantially perpendicular to the first nanowires.

3. The nanostructure according to claim 2, wherein the base is disposed on a support substrate.

4. The nanostructure according to claim 2, wherein the insulating material covers the base between two adjacent first nanowires, at least two adjacent second nanowires are connected by the layer of doped semi-conducting material of the second type, above the insulating material.

5. The nanostructure according to claim 4, comprising
   at least one assembly comprising
      a plurality of junctions electrically connected in parallel and each formed by series connection of the first nanowire, of the corresponding droplet and of the associated second nanowire,
      a first connection terminal of the assembly being formed by a zone of the base salient from one side of the assembly, and
      a second connection terminal of the assembly being formed by a different lateral zone of the layer of doped semi-conducting material of the second type.

6. The nanostructure according to claim 5, comprising at least two assemblies electrically connected in series, the first connection terminal of one of the assemblies being connected to the second connection terminal of an adjacent assembly.

7. A thermoelectric converter comprising the nanostructure of claim 1.

8. The thermoelectric converter according to claim 7, wherein the thermoelectric converter is a gas sensor comprising a catalyst reactable with a gas to be detected.

9. A nanostructure comprising:
   a first nanowire including an associated second nanowire, wherein:
      the first nanowire is made of doped semi-conducting material of a first type;
      the second nanowire is made of doped semi-conducting material of a second type,
      wherein one of the first and second type is p-doped and the other is n-doped; the first nanowire is coaxial with its associated second nanowire;
      the first and the second nanowires are separated by an insulating material; and
      a droplet is disposed on a tip of the second nanowire so as to individually electrically connect the second nanowire to its associated first nanowire.

10. A method for producing a nanostructure comprising growth step to form an array of nanowires on a substrate, said nanowires being made from doped semi-conducting material of a first type, each nanowire having, at the end of the growth step, a droplet of electrically conducting material on a tip thereof, which droplet acted as catalyst during the growth step, said method then comprising forming a coaxial layer of electrically insulating material around each nanowire, said layer not covering the corresponding droplet, and covering the layer of insulating material and the droplet associated with each nanowire with a coaxial layer of doped semi-conducting material of a second type, wherein one of the first and second type is p-doped and the other is n-doped, the droplet constituting an individual electric junction between the associated nanowire and the layer coaxial of dope semi-conducting material of the second type.

11. The method according to claim 10, wherein the layer of electrically insulating material is formed by selective oxidation of the nanowires at the periphery of the latter.

12. The method according to claim 11, wherein the doped semi-conducting materials are respectively of n and p type.

* * * * *